(12) United States Patent
Wang et al.

(10) Patent No.: US 11,729,994 B2
(45) Date of Patent: Aug. 15, 2023

(54) STRUCTURES FOR TESTING NANOSCALE DEVICES INCLUDING FERROELECTRIC CAPACITORS AND METHODS FOR FORMING THE SAME

(71) Applicant: Taiwan Semiconductor Manufacturing Company Limited, Hsinchu (TW)

(72) Inventors: Chenchen Jacob Wang, Hsinchu (TW); Yu-Ming Lin, Hsinchu (TW); Chi On Chui, Hsinchu (TW); Sai-Hooi Yeong, Zhubei (TW); Bo-Feng Young, Taipei (TW)

( * ) Notice: Subject to any disclaimer, the term of this patent is extended or adjusted under 35 U.S.C. 154(b) by 0 days.

(21) Appl. No.: 17/496,857

(22) Filed: Oct. 8, 2021

(65) Prior Publication Data

US 2022/0028875 A1    Jan. 27, 2022

Related U.S. Application Data

(62) Division of application No. 16/852,662, filed on Apr. 20, 2020, now Pat. No. 11,183,504.

(51) Int. Cl.
*H10B 53/30* (2023.01)
*H01L 27/07* (2006.01)
(Continued)

(52) U.S. Cl.
CPC ......... *H10B 53/30* (2023.02); *H01L 23/5223* (2013.01); *H01L 27/0629* (2013.01);
(Continued)

(58) Field of Classification Search
CPC ........... H01L 27/11507; H01L 23/5223; H01L 27/0629; H01L 27/0733; H01L 28/60; H01L 21/56; H01L 28/40; H01L 27/016; H01L 28/55; H01L 22/34; H01L 22/14; H01L 22/30; H10B 53/30
(Continued)

(56) References Cited

U.S. PATENT DOCUMENTS 6,730,950 B1 * 5/2004 Seshadri ................. H01L 28/60
257/532
6,952,028 B2 * 10/2005 Lee ........................ H10B 53/00
257/295

(Continued)

*Primary Examiner* — Duy T Nguyen
(74) *Attorney, Agent, or Firm* — The Marbury Law Group, PLLC

(57) ABSTRACT

A ferroelectric device structure includes an array of ferroelectric capacitors overlying a substrate, first metal interconnect structures electrically connecting each of first electrodes of the array of ferroelectric capacitors to a first metal pad embedded in a dielectric material layer, and second metal interconnect structures electrically connecting each of the second electrodes of the array of ferroelectric capacitors to a second metal pad embedded in the dielectric material layer. The second metal pad may be vertically spaced from the substrate by a same vertical separation distance as the first metal pad is from the substrate. First metal lines laterally extending along a first horizontal direction may electrically connect the first electrodes to the first metal pad, and second metal lines laterally extending along the first horizontal direction may electrically connect each of the second electrodes to the second metal pad.

20 Claims, 11 Drawing Sheets

(51) Int. Cl.
    *H01L 27/06* (2006.01)
    *H01L 23/522* (2006.01)
    *H01L 21/56* (2006.01)
    *H01L 49/02* (2006.01)

(52) U.S. Cl.
    CPC .......... *H01L 27/0733* (2013.01); *H01L 28/60* (2013.01); *H01L 21/56* (2013.01)

(58) Field of Classification Search
    USPC ........................................................ 438/157
    See application file for complete search history.

(56) References Cited

U.S. PATENT DOCUMENTS

| | | | |
|---|---|---|---|
| 2002/0105017 A1* | 8/2002 | Kim | ................ H01L 28/60 257/295 |
| 2004/0235245 A1 | 11/2004 | Summerfelt | |
| 2008/0121953 A1 | 5/2008 | Summerfelt | |
| 2008/0230818 A1 | 9/2008 | Kumura et al. | |
| 2012/0168837 A1 | 7/2012 | Bartling et al. | |
| 2013/0062733 A1 | 3/2013 | Summerfelt et al. | |
| 2020/0091162 A1* | 3/2020 | Morris | ................ G11C 11/2273 |

* cited by examiner

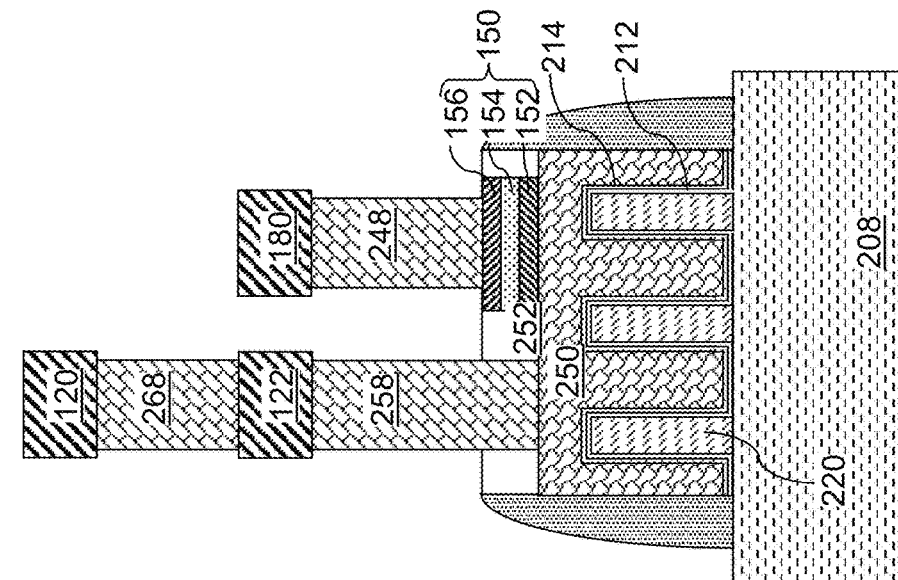
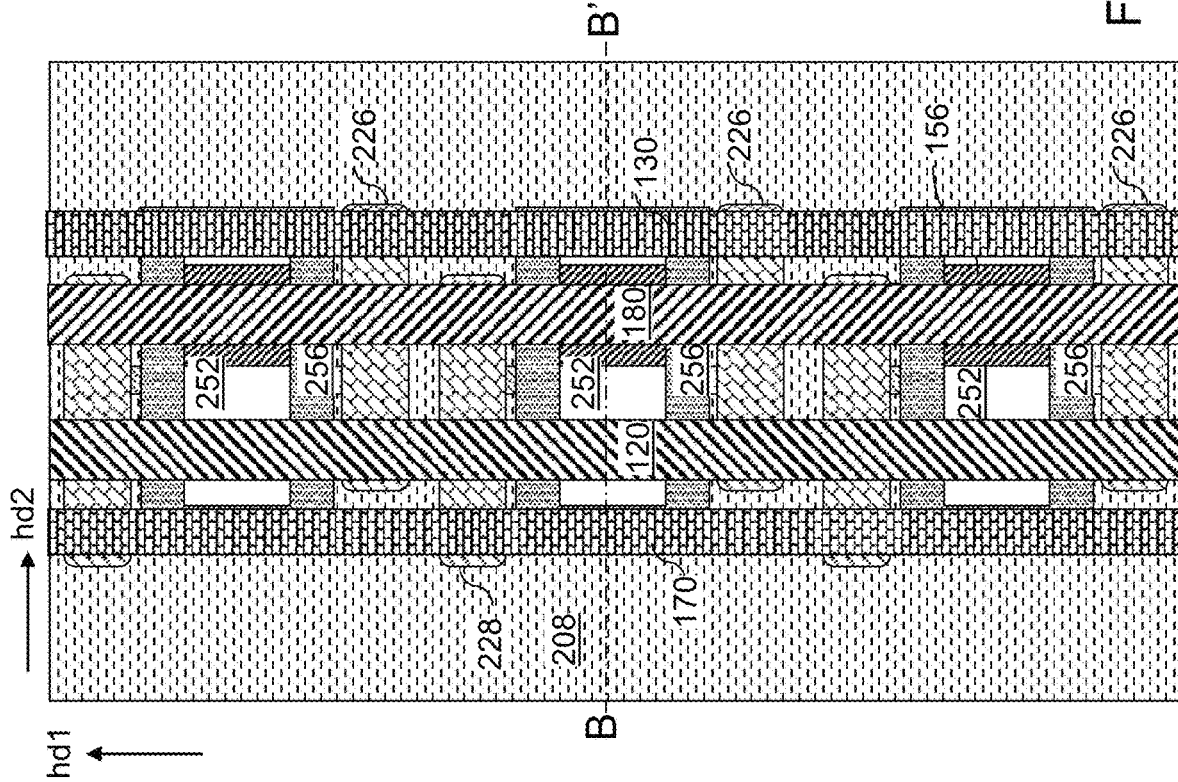
FIG. 7A
FIG. 7B

STRUCTURES FOR TESTING NANOSCALE DEVICES INCLUDING FERROELECTRIC CAPACITORS AND METHODS FOR FORMING THE SAME

RELATED APPLICATION

The instant application is a divisional application of U.S. application Ser. No. 16/852,662, entitled "Structures for Testing Nanoscale Devices Including Ferroelectric Capacitors and Methods for Forming the Same" filed on, Apr. 20, 2020 and subsequently issued as U.S. Pat. No. 11,183,504 on Nov. 23, 2021, the entire contents of which are incorporated herein by reference for all purposes.

BACKGROUND

A ferroelectric random access memory (FeRAM) device is a non-volatile memory device that offers low power consumption and compatibility for integration with mainstream complementary metal oxide semiconductor (CMOS) technology. FeRAM devices offer compact footprints as compared to static random access memory (SRAM) devices because the ferroelectric material plate may have a small size. A single ferroelectric material plate may have an area less than 500 nm$^2$. A typical semiconductor characterization tool may not effectively characterize electrical characteristics of a single ferroelectric plate of such a size because the strength of electrical signal generated from such a ferromagnetic plate is too weak.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A is a top-down view of a row of unit cell structures within the second exemplary test structure after formation of metal lines thereabove according to the second embodiment of the present disclosure.

FIG. 7B is a vertical cross-sectional view of the second exemplary test structure along the vertical plane B-B' of FIG. 7A.

DETAILED DESCRIPTION

Figure 1:
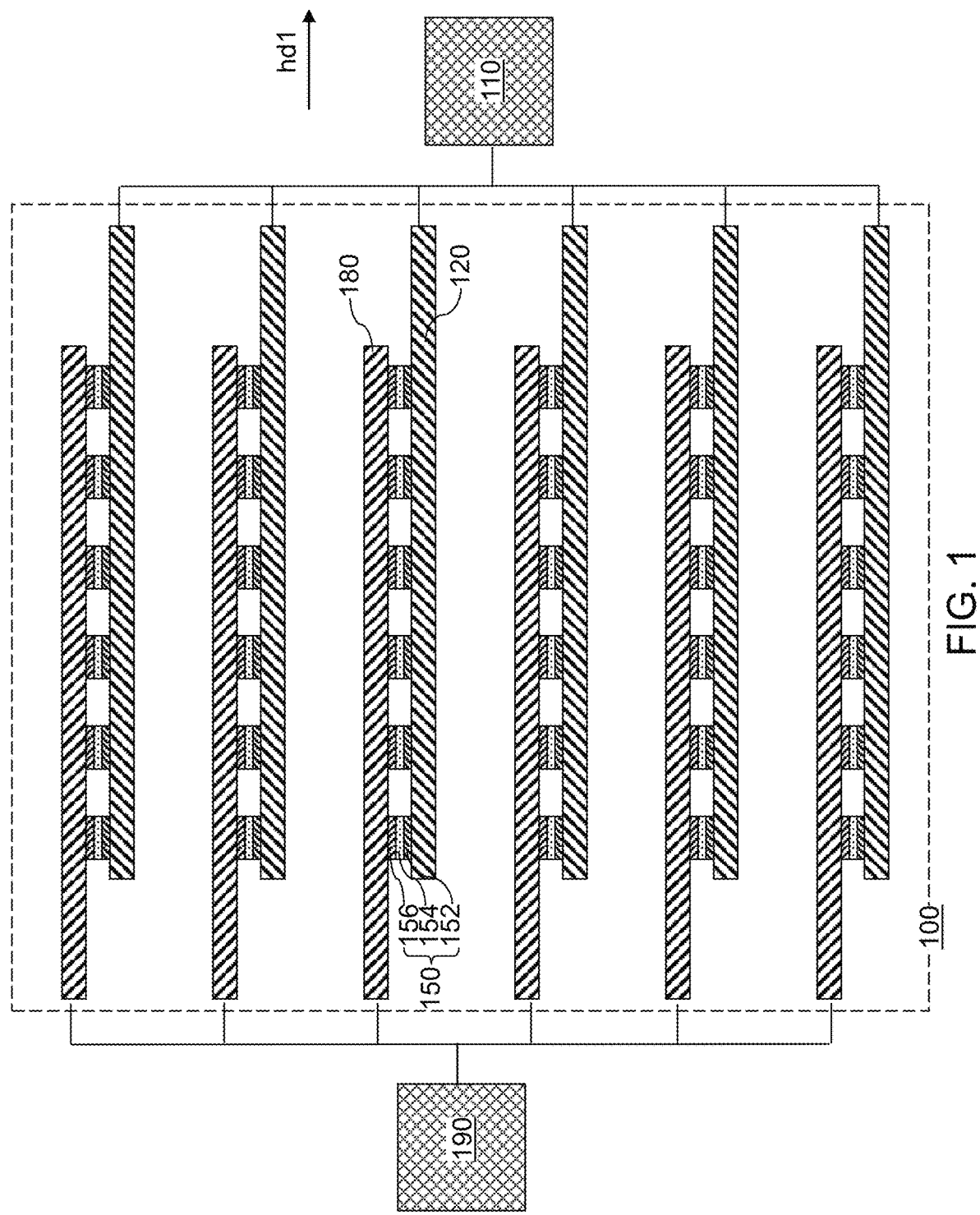
FIG. 1 is a schematic view of a first exemplary test structure for a nanoscale ferroelectric device according to a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements have the same reference numeral are presumed to have the same material composition unless expressly described otherwise.

The present disclosure is directed to semiconductor devices, and specifically to structures for testing nanoscale devices including ferroelectric capacitors and methods of forming the same.

Generally, the structures and methods of the present disclosure may be used to provide a test structure for testing electrical characteristics of ferroelectric devices including a ferroelectric capacitor having capacitance that is below minimum capacitance that may be measured directly using typical semiconductor device test probes. For example, a ferroelectric capacitor having a total area less than 1 μm$^2$ does not provide sufficient capacitance that allows direct measurement of device characteristics. Moreover, a scaled-up version of a small ferroelectric capacitor does not provide accurate characterization of the small ferroelectric capacitor because devices of a smaller scale have different material properties of components. The various methods and structures of the present disclosure provide test structures for accurate characterization of nanoscale ferroelectric devices such as a ferroelectric memory device connected to a gate electrode of a field effect transistor or stand-alone ferroelectric capacitors. Various features of the structures and methods of the present disclosure are described in detail herebelow.

Referring to FIG. 1, a first exemplary test structure for a nanoscale ferroelectric device according to a first embodiment of the present disclosure is schematically illustrated. The first exemplary test structure includes a plurality of ferroelectric capacitors 150 that are arranged as a two-dimensional array. The two-dimensional array of ferroelectric capacitors 150 may be arranged as multiple rows of ferroelectric capacitors 150. Each row of ferroelectric capacitors 150 may be arranged along a horizontal direction, which is herein referred to as a first horizontal direction hd1. The two-dimensional array of ferroelectric capacitors 150 forms a block 100, which may be provided in a device area.

Each ferroelectric capacitor 150 may include a vertical stack including, from bottom to top, a first electrode 152, a ferroelectric material plate 154, and a second electrode 156. The first electrodes 152 includes a first metallic material such as TiN, TaN, WN, Ti, Ta, W, Mo, Re, Nb, an alloy thereof, and/or a stack thereof. Other suitable metallic materials are within the contemplated scope of disclosure. The thickness of the first electrodes 152 may be in a range from 3 nm to 100 nm, such as from 6 nm to 50 nm, although lesser and greater thicknesses may also be used. The ferroelectric material plates 154 includes a ferroelectric material, i.e., a material that exhibits spontaneous electric polarization that may be reversed by the application of an external electric field. For example, the ferroelectric material plates 154 may include any of barium titanate, colemanite, bismuth titanate, europium barium titanate, ferroelectric polymer, germanium telluride, langbeinite, lead scandium tantalate, lead titanate, lead zirconate titanate, lithium niobate, polyvinylidene fluoride, potassium niobate, potassium sodium tartrate, potassium titanyl phosphate, sodium bismuth titanate, lithium tantalate, lead lanthanum titanate, lead lanthanum zirconate titanate, ammonium dihydrogen phosphate, potassium dihydrogen phosphate, and/or 111-V based ferroelectirc materials such as AlScN, GaScN, and AlYN.

Other suitable ferroelectric materials are within the contemplated scope of disclosure. The thickness of each ferroelectric material plate 154 may be in a range from 1 nm to 20 nm, such as from 2 nm to 15 nm, although lesser and greater thicknesses may also be used. The second electrodes 156 includes a first metallic material such as TiN, TaN, WN, Ti, Ta, W, Mo, Re, Nb, an alloy thereof, and/or a stack thereof. Other suitable metallic materials are within the contemplated scope of disclosure. The thickness of the second electrodes 156 may be in a range from 3 nm to 100 nm, such as from 6 nm to 50 nm, although lesser and greater thicknesses may also be used.

The first electrodes 152 within each row of ferroelectric capacitors 150 may contact a respective first metal line 120 that laterally extends along the first horizontal direction hd1. The second electrodes 156 within each row of ferroelectric capacitors 150 may contact a respective second metal line 180 that laterally extends along the first horizontal direction hd1. Additional metal interconnect structures that are schematically represented as electrical connection lines may be used to electrically connect each of the first metal lines 120 to a first metal pad 110, and to electrically connect each of the second metal lines 180 to a second metal pad 190. Each of the first metal pad 110 and the second metal pad 190 may be a respective test pad located within a set of in-line metal pads or within a two-dimensional array of metal pads. For example, each of the first metal pad 110 and the second metal pad 190 may be located within a periodic array of metal pads having a periodic pitch greater than 120 microns. Each metal pad in a periodic array of metal pads may have a rectangular shape with sides having lateral dimensions in a range from 40 microns to 100 microns. The metal pads may have other suitable shapes, including but not limited to circular, elliptical, square, etc.

In one embodiment, the array of ferroelectric capacitors 150 comprises N ferroelectric capacitors 150. Each of the N ferroelectric capacitors 150 may have a same area that is in a range from 1 $\mu m^2$/N to 1 $\mu m^2$, in which N is an integer greater than 1. In one embodiment, N may be in a range from $2^2$ to $2^{14}$, such as from $2^4$ to $2^{10}$.

In an illustrative example, if a 10×10 array of 100 ferroelectric capacitors 150 is used, each ferroelectric capacitor 150 may have the same area that may be in a range from 0.01 $\mu m^2$ to 1 $\mu m^2$. The electrical characteristics of the array of ferroelectric capacitors 150 may be tested by landing probe needles of a test probe onto the first metal pad 110 and onto the second metal pad 190, and by applying external voltage bias across the first metal pad 110 and the second metal pad 190 and measuring electrical current between the first metal pad 110 and the second metal pad 190. The applied external bias voltage may be an AC bias voltage.

Figure 2:
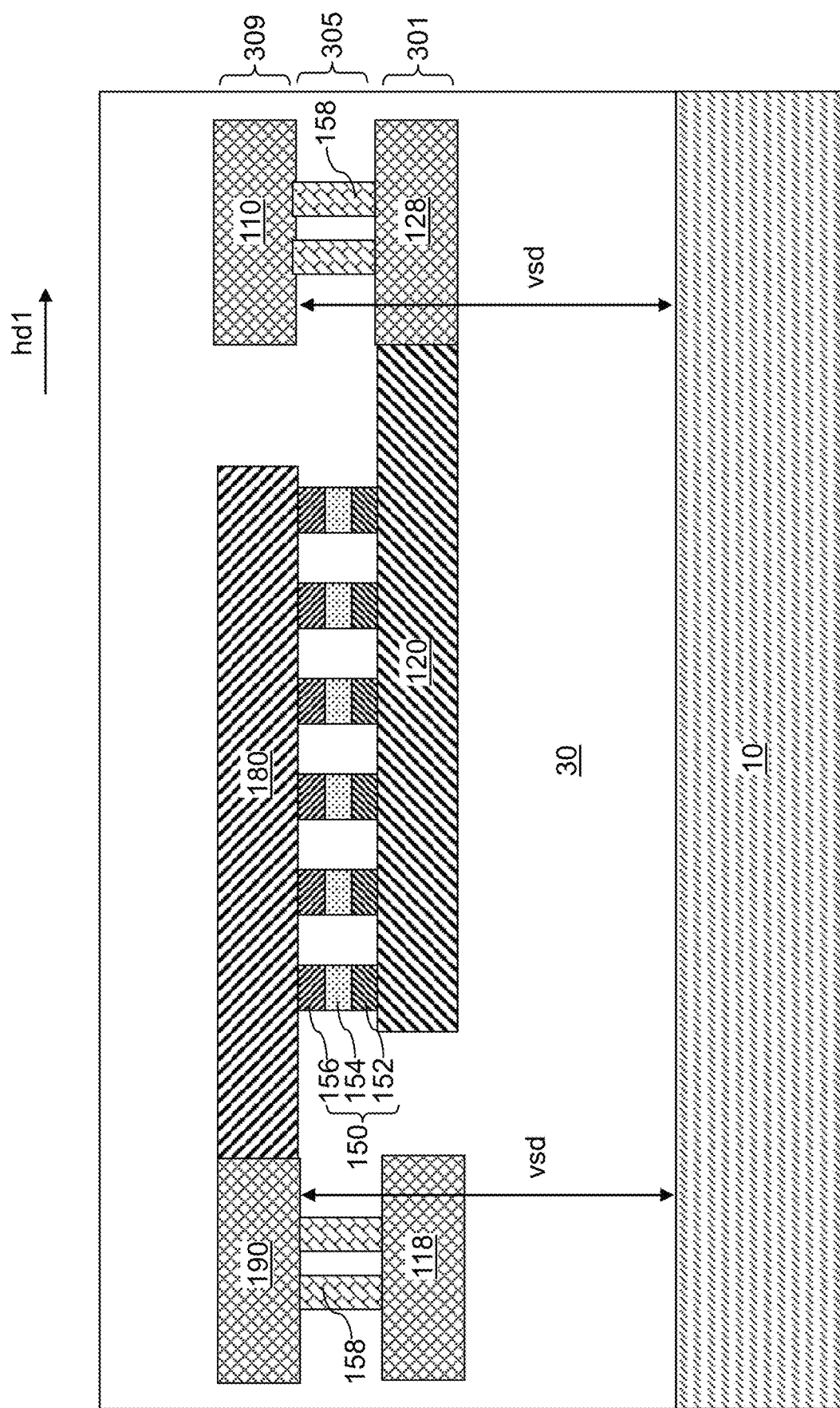
FIG. 2 is a vertical cross-sectional view of the first exemplary test structure according to the first embodiment of the present disclosure.

Referring to FIG. 2, a vertical cross-sectional view of the first exemplary test structure is illustrated. The first exemplary test structure may be constructed from bottom to top by forming a series of interconnect-level dielectric material layers 30 embedding a respective set of structural components over a substrate 10. For example, the interconnect-level dielectric material layers 30 may include a first line-level dielectric material layer 301 embedding the first metal lines 120, a first line-level interconnection metal pad 128 electrically connected to the first metal lines 120, and a second line-level interconnection pad 118 that is electrically isolated from the first metal lines 120. The first line-level dielectric material layer 301 may be deposited over underlying interconnect-level dielectric material layers, and the first metal lines 120, the first line-level interconnection metal pad 128 and the second line-level interconnection pad 118 may be formed in the first line-level dielectric material layer 301 by patterning line cavities and pad cavities in the first line-level dielectric material layer 301, and by filling the line cavities and the pad cavities.

The interconnect-level dielectric material layers 30 may include a capacitor-level dielectric material layer 305 overlying the first line-level dielectric material layer 301 and embedding the array of ferroelectric capacitors 150, which may be a two-dimensional array of ferroelectric capacitors 150. The two-dimensional array of ferroelectric capacitors 150 may be formed by depositing a layer stack of a first continuous electrode material layer, a continuous ferroelectric material layer, and a second continuous electrode material layer, by applying and lithographically patterning a photoresist layer over the layer stack to form a two-dimensional array discrete photoresist material portions, and by transferring the pattern in the two-dimensional array of discrete photoresist material portions through the layer stack. Each patterned portion of the layer stack constitutes a ferroelectric capacitor 150. A dielectric material may be subsequently applied over the two-dimensional array of ferroelectric capacitors, and may be subsequently planarized to form the capacitor-level dielectric material layer 305. Each ferroelectric capacitor 150 in the array of ferroelectric capacitors 150 includes a vertical stack containing, from bottom to top, a respective first electrode 152, a respective ferroelectric material plate 154, and a respective second electrode 156. Each of the first metal lines 120 is electrically connected to, and contacts bottom surfaces of, a respective row of first electrodes 152 arranged along the first horizontal direction hd1. A respective row of first electrodes 152 within the array of ferroelectric capacitors 150 may be formed on a top surface of each of the first metal lines 120.

A photoresist layer (not shown) may be applied over the capacitor-level dielectric material layer 305, and may be lithographically patterned to form openings within areas of the first line-level interconnection metal pad 128 and the second line-level interconnection pad 118. An anisotropic etch process may be performed to form via cavities extending through the capacitor-level dielectric material layer 305 underneath each opening in the photoresist layer. A top surface of the first line-level interconnection metal pad 128 or a top surface of the second line-level interconnection pad 118 may be physically exposed at the bottom of the via cavities. The photoresist layer may be removed, for example, by ashing. At least one conductive material such as a metallic nitride liner material and a metallic fill material (such as copper or tungsten) may be deposited in the via cavities, and excess portions of the at least one conductive material may be removed from above the horizontal plane including the top surface of the capacitor-level dielectric material layer 305. Remaining portions of the at least one conductive material filling the via cavities comprise interconnection via structures 158.

The second line-level dielectric material layer 309 may be deposited over the capacitor-level dielectric material layer 305, and the second metal lines 180, the first metal pad 110, and the second metal pad 190 may be formed in the second line-level dielectric material layer 309 by patterning line cavities and pad cavities in the second line-level dielectric material layer 309, and by filling the line cavities and the pad cavities. Each second metal line 180 may be formed on top surfaces of a respective row of second electrodes 156 within the array of ferroelectric capacitors 150. The first metal pad 110 may be electrically connected to the first metal lines 120, and the second metal pad 190 may be electrically connected to, and may be laterally adjoined to, the second metal lines 180.

The second metal lines 180 may be formed over the array of ferroelectric capacitors 150. Each of the second metal lines 180 may be electrically connected to a respective row of second electrodes 156 arranged along the first horizontal direction hd1. The first metal pad 110 and the second metal pad 190 may be formed within a same dielectric material layer (such as the second line-level dielectric material layer 309) over a horizontal plane including top surfaces of the array of ferroelectric capacitors 150. The first metal pad 110 and the second metal pad 190 may be vertically spaced from the top surface of the substrate 10 by a same vertical separation distance vsd.

Figure 3A:
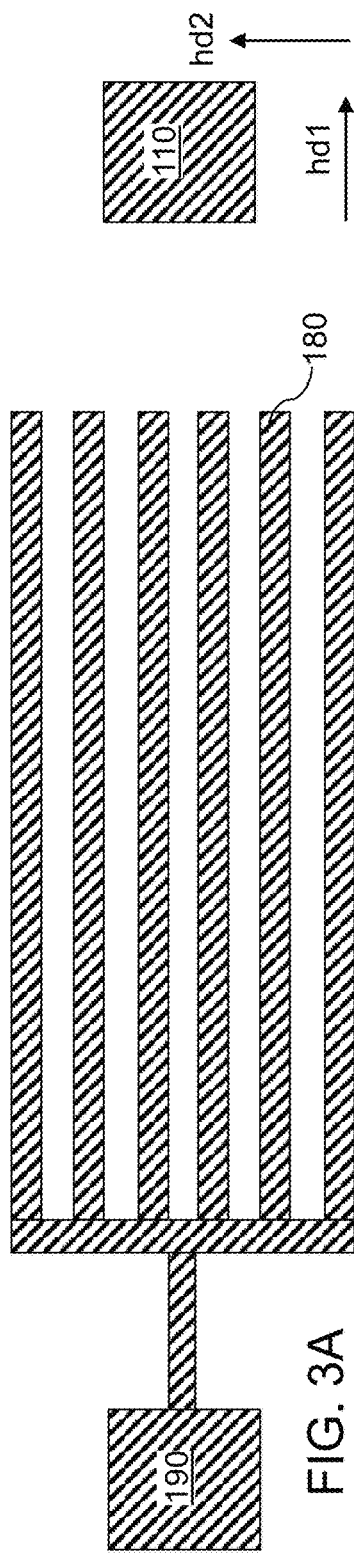
FIG. 3A is a horizontal cross-sectional view of the first exemplary test structure at a level of first metal lines according to the first embodiment of the present disclosure.
Figure 3B:
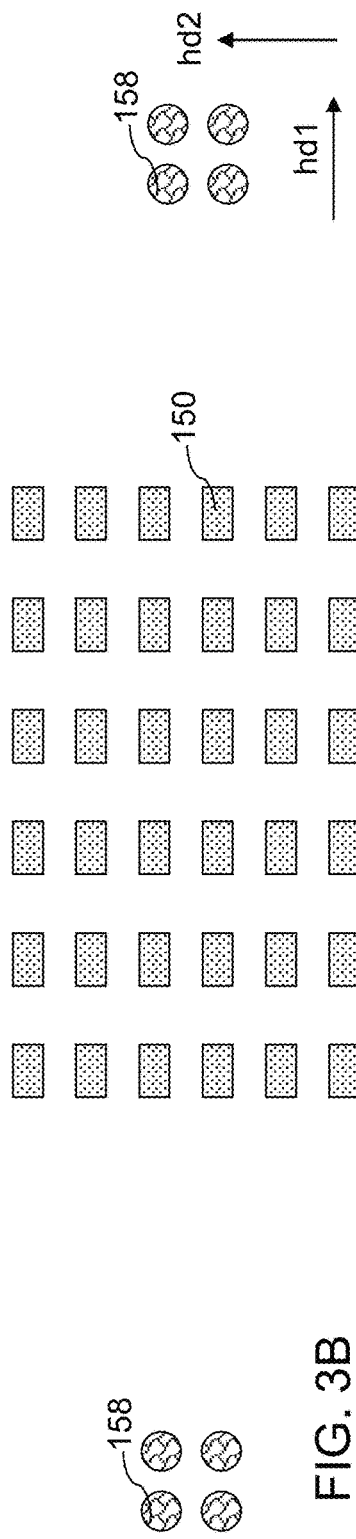
FIG. 3B is a horizontal cross-sectional view of the first exemplary test structure at a level of ferroelectric material plates according to the first embodiment of the present disclosure.
Figure 3C:
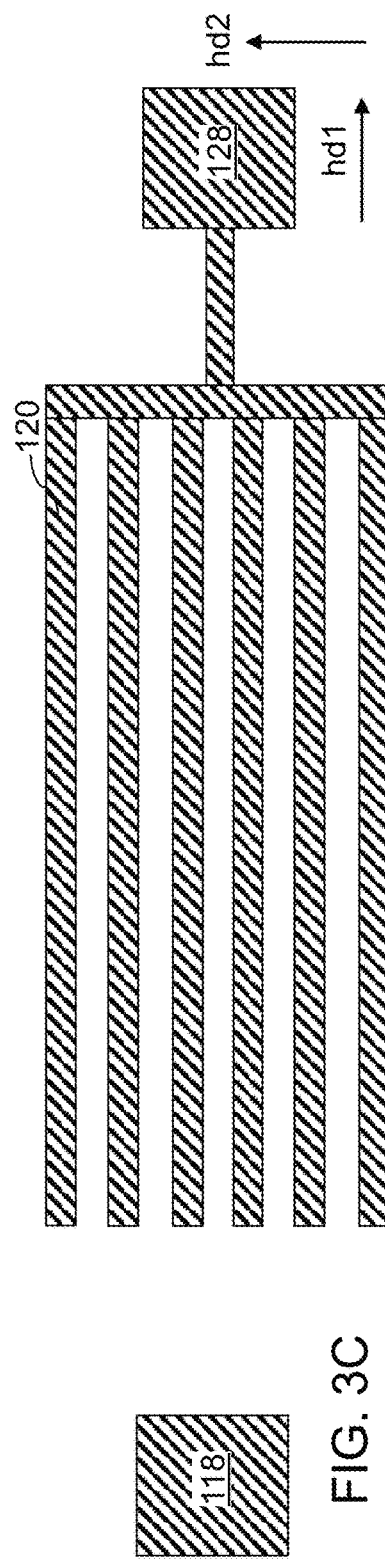
FIG. 3C is a horizontal cross-sectional view of the first exemplary test structure at a level of second metal lines according to the first embodiment of the present disclosure.

Referring to FIGS. 3A-3C, various horizontal cross-sectional views of the first exemplary test structure are illustrated. FIG. 3A corresponds to a horizontal cross-sectional view at a level of first metal lines 120, FIG. 3B corresponds to a horizontal cross-sectional view of the first exemplary test structure at a level of ferroelectric material plates 154, and FIG. 3C corresponds to a horizontal cross-sectional view of the first exemplary test structure at a level of second metal lines 180.

Generally, each of the first electrodes 152 of the array of ferroelectric capacitors 150 contacts a respective first conductive structure that underlies a horizontal plane including bottom surfaces of the array of ferroelectric capacitors 150. Each of the second electrodes 156 of the array of ferroelectric capacitors 150 contacts a respective second conductive structure that overlies a horizontal plane including top surfaces of the array of ferroelectric capacitors 150.

In one embodiment, the first conductive structures comprise an array of first metal lines 120 located at a first metal line level, the second conductive structures comprise an array of second metal lines 180 located at a second metal line level that overlies the first metal line level. First metal interconnect structures electrically connect the first electrodes 152 to the first metal pad 110. The first metal interconnect structures comprise an interconnection metal pad (such as a first line-level interconnection metal pad 128) electrically connected to the array of first metal lines 120, and an interconnection via structure 158 contacting a top surface of the interconnection metal pad and contacting a bottom surface of the first metal pad 110. In one embodiment, each second metal line 180 may have an areal overlap with a respective first metal line 120 in a plan view, i.e., a view along a direction that is perpendicular to a top surface of the substrate 10. The first metal lines 120 and the second metal lines 180 may laterally extend along the first horizontal direction hd1, and may be laterally spaced from one another along a second horizontal direction hd2 that is perpendicular to the first horizontal direction hd1.

In one embodiment, the two-dimensional array of ferroelectric capacitors 150 comprises multiple rows of ferroelectric capacitors 150; each row of ferroelectric capacitors 150 may be arranged along the first horizontal direction hd1; adjacent rows of ferroelectric capacitors 150 may be spaced from each other along a second horizontal direction hd2 that is perpendicular to the first horizontal direction hd1; and each of the second metal lines 180 has an areal overlap with a respective one of the first metal lines 120 in a plan view along a direction that is perpendicular to a top surface of the substrate 10.

Figure 4:
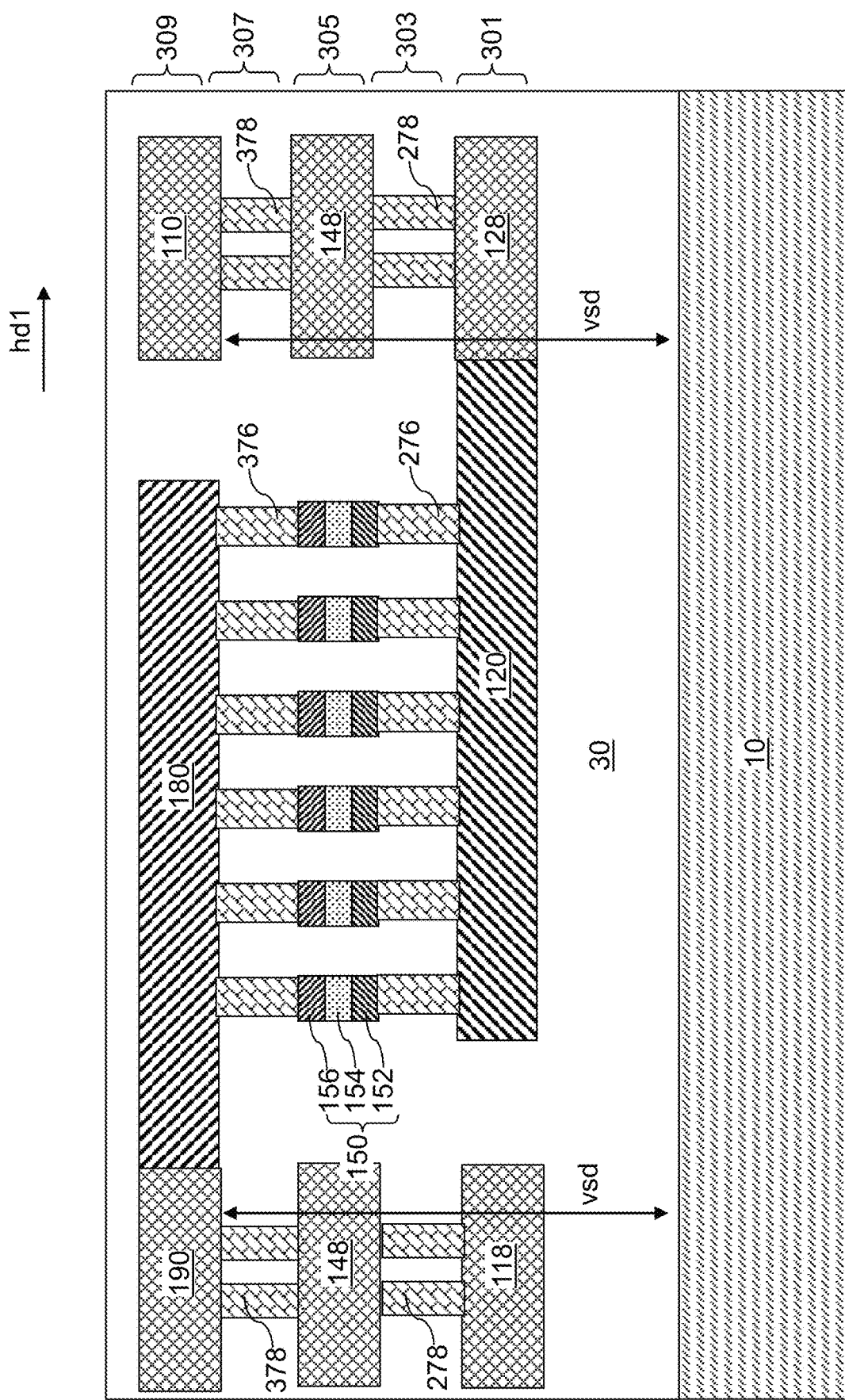
FIG. 4 is a vertical cross-sectional view of a first alternative embodiment of the first exemplary test structure according to the first embodiment of the present disclosure.

Referring to FIG. 4, a first alternative embodiment of the first exemplary test structure according to the first embodiment of the present disclosure may be derived from the first exemplary test structure of FIGS. 2A-2C and 3 by electrically connecting the first electrodes 152 of the ferroelectric capacitors 150 using first metal via structures 276, and by electrically connecting the second electrodes 156 of the ferroelectric capacitors 150 using second metal via structures 376.

The first alternative embodiment of the first exemplary test structure may be constructed from bottom to top by forming a series of interconnect-level dielectric material layers 30 embedding a respective set of structural components over a substrate 10. For example, the interconnect-level dielectric material layers 30 may include a first line-level dielectric material layer 301 embedding the first metal lines 120, a first line-level interconnection metal pad 128 electrically connected to the first metal lines 120, and a second line-level interconnection pad 118 that is electrically isolated from the first metal lines 120. The first line-level dielectric material layer 301, the first metal lines 120, the first line-level interconnection metal pad 128, and a second line-level interconnection pad 118 may be formed in the same manner as described above.

The interconnect-level dielectric material layers 30 may include a first via-level dielectric material layer 303 that may be formed over the first line-level dielectric material layer 301. A two-dimensional array of first metal via structures 276 may be formed through the first via-level dielectric material layer 303 on top surfaces of the first metal lines 120. In this embodiment, a row of first metal via structures 276 may be formed on a top surface of each of the first metal lines 120. First interconnection via structures 278 may be formed though the first via-level dielectric material layer 303 concurrently with formation of the two-dimensional array of first metal via structures 276. Each of the first interconnection via structures 278 may be formed on a top surface of the first line-level interconnection metal pad 128 or a top surface of the second line-level interconnection pad 118.

The interconnect-level dielectric material layers 30 may include a capacitor-level dielectric material layer 305 overlying the first via-level dielectric material layer 303 and embedding the array of ferroelectric capacitors 150, which may be a two-dimensional array of ferroelectric capacitors 150. The two-dimensional array of ferroelectric capacitors 150 may be formed in the same manner as described above. Each of the ferroelectric capacitors 150 may be formed directly on a top surface of a respective one of the first metal via structures 276. Connection metal pads 148 may be formed on the first interconnection via structures 278.

The interconnect-level dielectric material layers 30 may include a second via-level dielectric material layer 307 that is formed over the capacitor-level dielectric material layer 305. A two-dimensional array of second metal via structures 276 may be formed through the second via-level dielectric material layer 307 on the top surfaces of the ferroelectric capacitors 150, i.e., on the top surfaces of the second electrodes 156. In this embodiment, each second metal via structure 376 may be formed on a top surface of each second electrode 156. Thus, a row of second metal via structures 376 may be formed on top surfaces of each row of ferroelectric capacitors 150. Second interconnection via structures 378 may be formed though the second via-level dielectric material layer 307 concurrently with formation of the two-dimensional array of second metal via structures 376. Each of the second interconnection via structures 378 may be formed on the connection metal pads 148.

The second line-level dielectric material layer 309 may be deposited over the second via-level dielectric material layer 307, and the second metal lines 180, the first metal pad 110, and the second metal pad 190 may be formed in the second line-level dielectric material layer 309 by patterning line cavities and pad cavities in the second line-level dielectric material layer 309, and by filling the line cavities and the pad cavities. Each second metal line 180 may be formed on top surfaces of a respective row of second metal via structures 376. The first metal pad 110 and the second metal pad 190 may be formed on a respective subset of the second interconnection via structures 378. The first metal pad 110 may be electrically connected to the first metal lines 120, and the second metal pad 190 may be electrically connected to, and may be laterally adjoined to, the second metal lines 180.

The second metal lines 180 may be formed over the array of ferroelectric capacitors 150. Each of the second metal lines 180 may be electrically connected to a respective row of second electrodes 156 arranged along the first horizontal direction hd1. The first metal pad 110 and the second metal pad 190 may be formed within a same dielectric material layer (such as the second line-level dielectric material layer 309) over a horizontal plane including top surfaces of the array of ferroelectric capacitors 150. The first metal pad 110 and the second metal pad 190 may be vertically spaced from the top surface of the substrate 10 by a same vertical separation distance vsd.

In one embodiment, the two-dimensional array of ferroelectric capacitors 150 comprises multiple rows of ferroelectric capacitors 150; each row of ferroelectric capacitors 150 may be arranged along the first horizontal direction hd1; adjacent rows of ferroelectric capacitors 150 may be spaced from each other along a second horizontal direction hd2 that is perpendicular to the first horizontal direction hd1; and each of the second metal lines 180 may have an areal overlap with a respective one of the first metal lines 120 in a plan view along a direction that is perpendicular to a top surface of the substrate 10.

Figure 5:
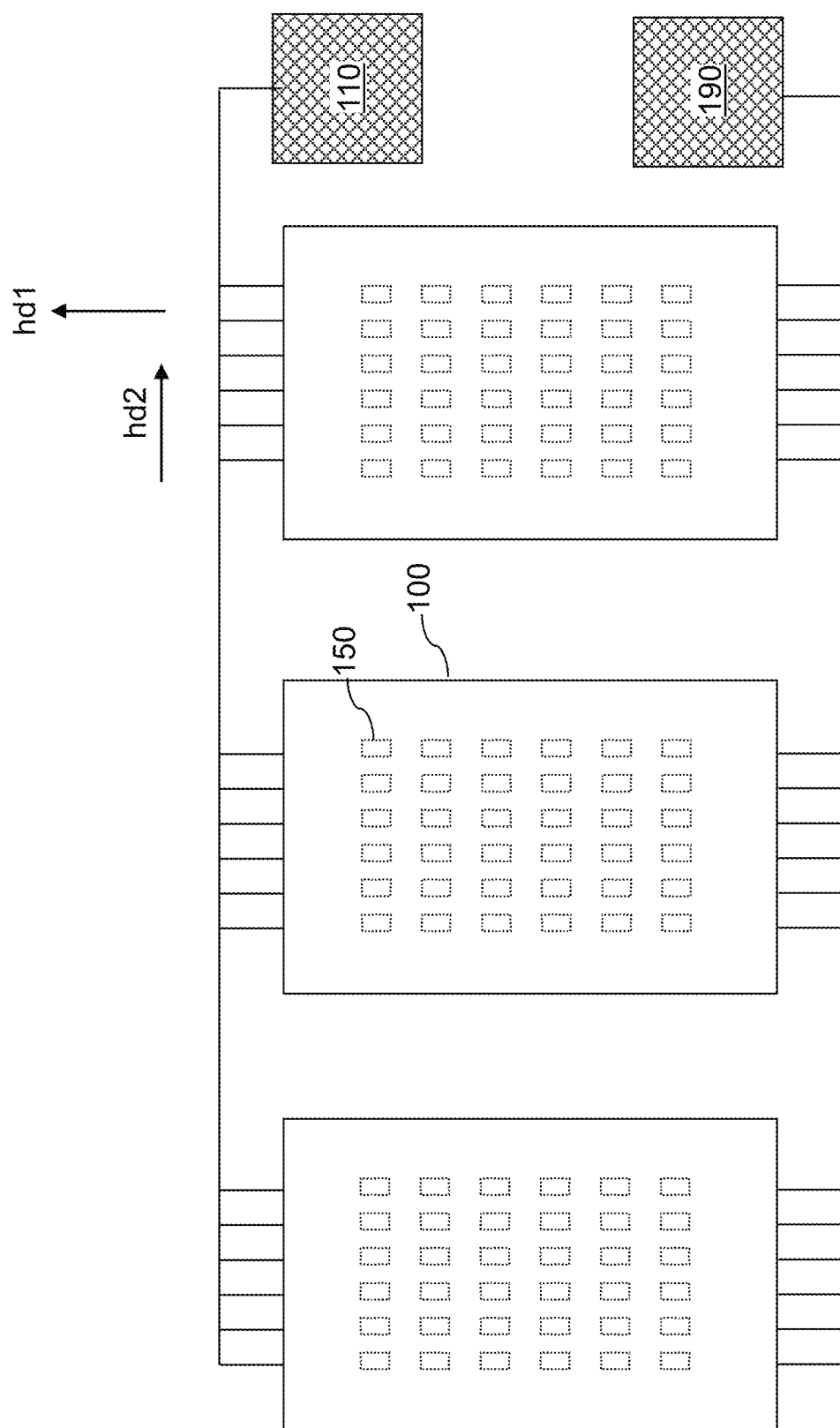
FIG. 5 is a plan view of a second alternative embodiment of the first exemplary test structure according to the first embodiment of the present disclosure.

Referring to FIG. 5, a second alternative embodiment of the first exemplary test structure according to the first embodiment of the present disclosure is illustrated. The second alternative embodiment of the first exemplary test structure may be derived from the first exemplary test structure of FIGS. 2A-2C and 3 or from the first alternative embodiment of the first exemplary test structure of FIG. 4 by forming multiple blocks 100. Each block 100 includes a respective two-dimensional array of ferroelectric capacitors 150. The multiple blocks 100 include multiple arrays of ferroelectric capacitors 150, which may be electrically connected in parallel electrical connection between the first metal pad 110 and the second metal pad 190. The first metal pad 110 and the second metal pad 190 may be formed in a same dielectric material layer.

Referring collectively to FIGS. 1-5 and according to various embodiments of the present disclosure, a method of forming a structure, such as a ferroelectric device structure, is provided. An array of ferroelectric capacitors 150 and first metal lines 120 may be formed over a substrate 10. Each ferroelectric capacitor 150 in the array of ferroelectric capacitors 150 comprises a vertical stack including a respective first electrode 152, a respective ferroelectric material plate 154, and a respective second electrode 156. Each of the first metal lines 120 may electrically connected to a respective row of first electrodes 152 arranged along a first horizontal direction hd1. Second metal lines 180 may be formed over the array of ferroelectric capacitors 150. Each of the second metal lines 180 may be electrically connected to a respective row of second electrodes 156 arranged along the first horizontal direction hd1. A first metal pad 110 and a second metal pad 190 may be formed over a horizontal plane including top surfaces of the array of ferroelectric capacitors 150. The first metal pad 110 may be electrically connected to the first metal lines 120, and the second metal pad 190 is electrically connected to the second metal lines 180.

In one embodiment, the ferroelectric device structure includes: an array of ferroelectric capacitors 150 overlying a substrate 10 and comprising a respective first electrode 152, a respective ferroelectric material plate 154, and a respective second electrode 156, first metal interconnect structures (such as the first metal lines 120, the first line-level interconnection metal pad 128, and a subset of the interconnection via structures 158) electrically connecting each of the first electrodes 152 of the array of ferroelectric capacitors 150 to a first metal pad 110 embedded in a dielectric material layer (such as the second line-level dielectric material layer 309); and second metal interconnect structures electrically connecting each of the second electrodes 156 of the array of ferroelectric capacitors 150 to a second metal pad 190 embedded in the dielectric material layer. The second metal pad 190 may be vertically spaced from the substrate 10 by a same vertical separation distance vsd as the first metal pad 110 is from the substrate 10. In one embodiment, the respective ferroelectric material plate 154 contacts a top surface of the respective first electrode 152, and the respective second electrode 156 contacts a top surface of the respective ferroelectric material plate 154.

According to an embodiment of the present disclosure, the first exemplary test structure includes: a two-dimensional array of ferroelectric capacitors 150 overlying a substrate 10 and comprising a respective first electrode 152, a respective ferroelectric material plate 154, and a respective second electrode 156; first metal lines 120 laterally extending along a first horizontal direction hd1 and located at a first metal line level and electrically connecting each of the first electrodes 152 within the two-dimensional array of ferroelectric capacitors 150 to a first metal pad 110 embedded in a dielectric material layer (such as the second line-level dielectric material layer 309); and second metal lines 180 laterally extending along the first horizontal direction hd1 and located at a second metal line level and electrically connecting each of the second electrodes 156 within the two-dimensional array of ferroelectric capacitors 150 to a second metal pad 190 embedded in the dielectric material layer.

In one embodiment, the first metal lines 120 may be more proximal to the substrate 10 than the second metal lines 180 are to the substrate 10; and the second metal lines 180, the first metal pad 110, and the second metal pad 190 may be vertically spaced from the substrate by a same vertical separation distance vsd.

In one embodiment, the two-dimensional array of ferroelectric capacitors 150 comprises multiple rows of ferroelectric capacitors 150. Each row of ferroelectric capacitors 150 may be arranged along the first horizontal direction hd1. Adjacent rows of ferroelectric capacitors 150 are spaced from each other along a second horizontal direction hd2 that is perpendicular to the first horizontal direction hd1.

Figures 6A, 6B:
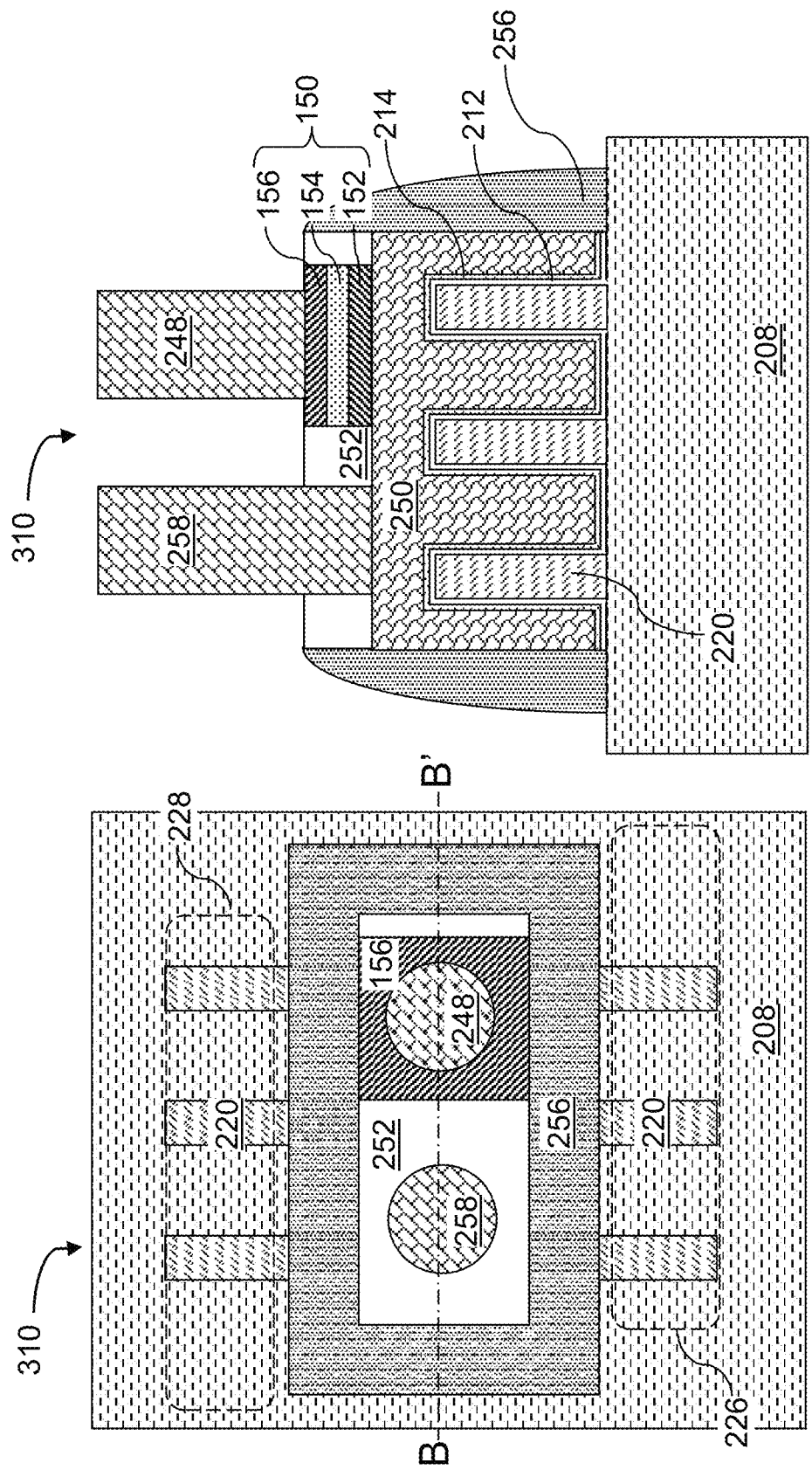
FIG. 6A is a top-down view of a unit cell structure within a second exemplary test structure after formation of gate-electrode-contact metal via structure and a ferroelectric-electrode-contact metal via structure according to a second embodiment of the present disclosure.
FIG. 6B is a vertical cross-sectional view of the unit cell structure along the vertical plane B-B' of FIG. 6A.
Figure 6C:
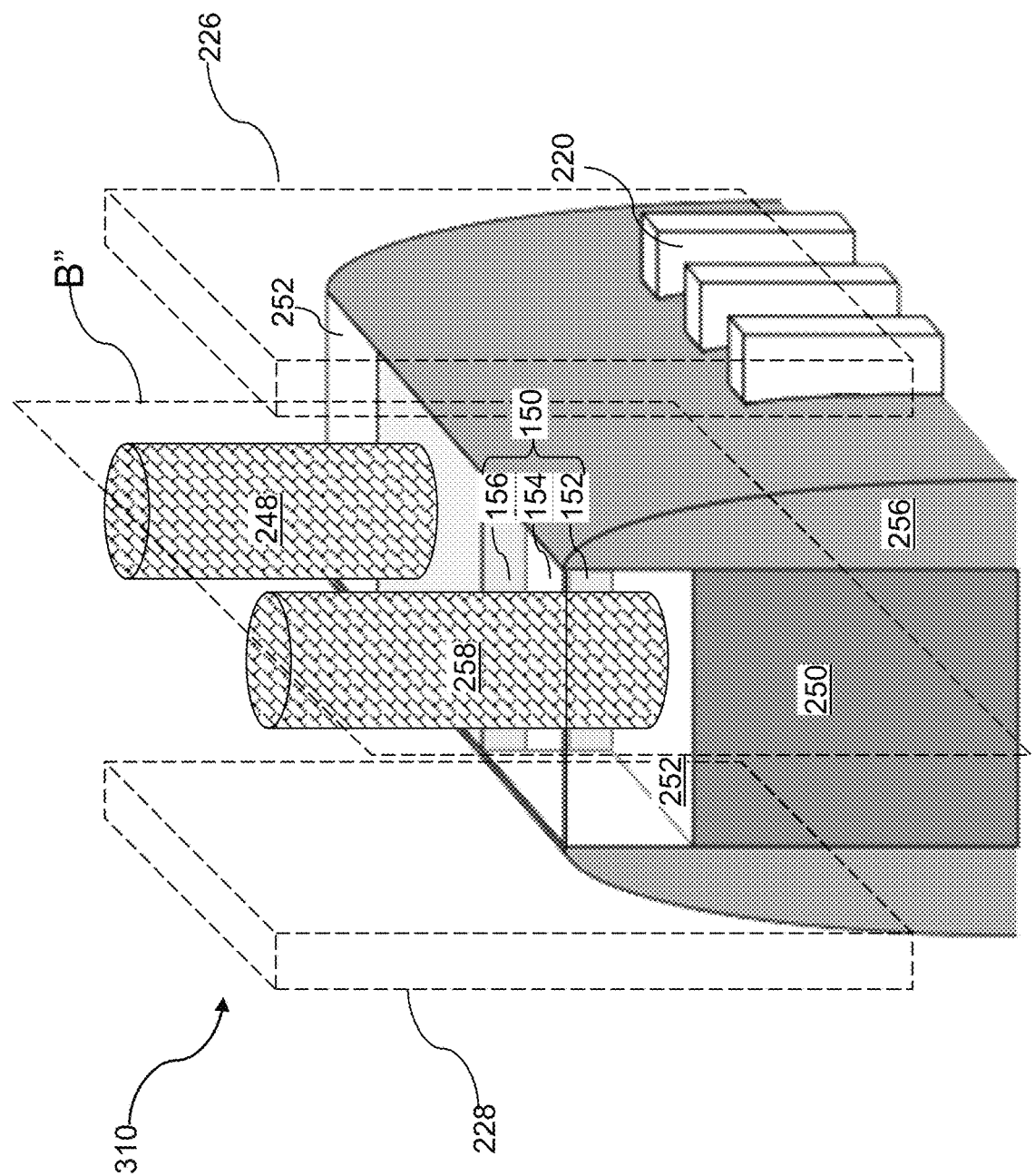
FIG. 6C is a perspective view of the unit cell structure of FIGS. 6A and 6B. The vertical plane B" is the plane of the vertical cross-sectional view of FIG. 6B.

Referring to FIGS. 6A-6C, a unit cell structure 310 within a second exemplary test structure is illustrated. While only a single unit cell structure 310 is illustrated, it is understood that a two-dimensional array of unit cell structures 310 may be formed over a substrate 208. In one embodiment, the substrate 208 may include an insulating material layer at a top portion thereof.

Each unit cell structure 310 includes a set of at least one semiconductor fin 220 having a respective shape of a rectangular parallelepiped. A gate stack including a gate dielectric (212, 214), a gate electrode 250, and a gate cap dielectric 252 may be formed over the set of at least one semiconductor fin 220 within each unit cell structure 310. Each gate stack (212, 214, 250) may straddle the middle portion of the at least one semiconductor fin 220. Each gate dielectric (212, 214) includes at least one of a silicon oxide gate dielectric 212 and a dielectric metal oxide gate dielectric 214. The gate electrode 250 may include a doped semiconductor gate electrode portion and/or a metallic gate electrode portion. The gate cap dielectric 252 overlies the gate electrode 250. A ferroelectric capacitor 150 including a first electrode 152, a ferroelectric material plate 154, and a second electrode 156 is formed on a top surface of each gate electrode 250. The ferroelectric capacitor 150 may be embedded within the gate cap dielectric 252 within each unit cell structure 310.

The unit cell structure 310 may be formed by providing a two-dimensional array of at least one semiconductor fin 220 over the substrate 208. At least one gate dielectric material layer and at least one gate electrode material layer may be deposited over the semiconductor fins 220. Optionally, the top surface of the at least one gate electrode material layer may be planarized, for example, by chemical mechanical planarization. A layer stack of a first continuous electrode material layer, a continuous ferroelectric material layer, and a second continuous electrode material layer may be subsequently deposited over the at least one gate electrode material layer. A first photoresist layer (not shown) may be applied over the layer stack, and is lithographically patterned to form a two-dimensional array of discrete photoresist material portions that masks discrete portions of the layer stack within areas that overlie the semiconductor fins 220. An anisotropic etch process is performed to transferring the pattern in the two-dimensional array of discrete photoresist material portions through the layer stack. The top surface of the at least one gate electrode material layer may be used as an etch stop surface for the anisotropic etch process. Each patterned portion of the layer stack constitutes a ferroelectric capacitor 150. The first photoresist layer may be removed, for example, by ashing.

A gate cap dielectric 252 material such as silicon nitride may be deposited over the two-dimensional array of ferroelectric capacitors 150, and may be planarized to provide a gate cap dielectric layer having a planarized horizontal top surface within the horizontal plane including the top surfaces of the ferroelectric capacitors 150. A second photoresist layer (not shown) may be formed over the gate cap dielectric layer, and may be lithographically patterned to form a gate pattern therein. The gate pattern in the second photoresist layer may be transferred through the gate cap dielectric layer, the at least one gate electrode material layer, and the at least one gate dielectric material layer using an anisotropic etch process. The chemistry of the anisotropic etch process may be selective to the semiconductor material of the semiconductor fins 220. Each remaining patterned portion of the gate cap dielectric layer comprises a gate cap dielectric 252. Each remaining patterned portion of the at least one gate electrode material layer comprises a gate electrode 250. Each remaining patterned portion of the at least one gate dielectric material layer comprises a gate dielectric (212, 214).

Electrical dopants may be implanted into portions of the semiconductor fins 220 that are not masked by the gate stacks (212, 214, 250) to form source regions and drain regions within the semiconductor fins 220. A dielectric gate spacer 256 may be formed around each gate stack (212, 214, 250) by conformally depositing and anisotropically etching a dielectric material layer. Additional electrical dopants may be implanted into the source regions and the drain regions within the semiconductor fins 220 after formation of the dielectric gate spacers 256. A planarization dielectric material may be deposited over the dielectric gate spacers 256 and the semiconductor fins 220, and may be subsequently planarized to form a planarization dielectric layer (not shown) having a horizontal top surface located above the horizontal plane including the top surfaces of the ferroelectric capacitors 150. Contact via structures (258, 248) may be formed through the planarization dielectric layer. The contact via structures (258, 248) may include gate-electrode-contact metal via structures 258 contacting a respective one of the gate electrodes 250, and ferroelectric-electrode-contact metal via structures 248 contacting a respective second electrode 156 of the ferroelectric capacitors 150. A source-contact metal via structure 226 may be formed on each source region within a respective set of at least one semiconductor fin 220, and a drain-contact metal via structure 228 may be formed on each drain region within a respective set of at least one semiconductor fin 220.

Generally, an array of field effect transistors may be formed over the substrate 208. An array of ferroelectric capacitors 150 may be formed directly on an array of gate electrodes 250 of the array of field effect transistors. Each first electrode of the ferroelectric capacitors 150 may contact a top surface of a respective one of the gate electrodes 250. In one embodiment, each field effect transistor within the array of field effect transistors may include a fin field effect transistor including a respective set of at least one semiconductor fin 220. Each set of at least one semiconductor fin 220 underlies a respective gate electrode 250 selected from the array of gate electrodes 250, and is electrically isolated from the respective gate electrode 250 by a respective gate dielectric (212, 214).

An array of gate-electrode-contact metal via structures 258 may be formed directly on a top surface of a respective gate electrode 250 selected from the array of gate electrodes 250. An array of ferroelectric-electrode-contact via structures 248 may be formed directly on a top surface of a respective second electrode 156 within the array of ferroelectric capacitors 150. Each ferroelectric capacitor 150 in the array of ferroelectric capacitors 150 comprises a vertical stack including a respective first electrode 152, a respective ferroelectric material plate 154, and a respective second electrode 156.

Figure 7C:
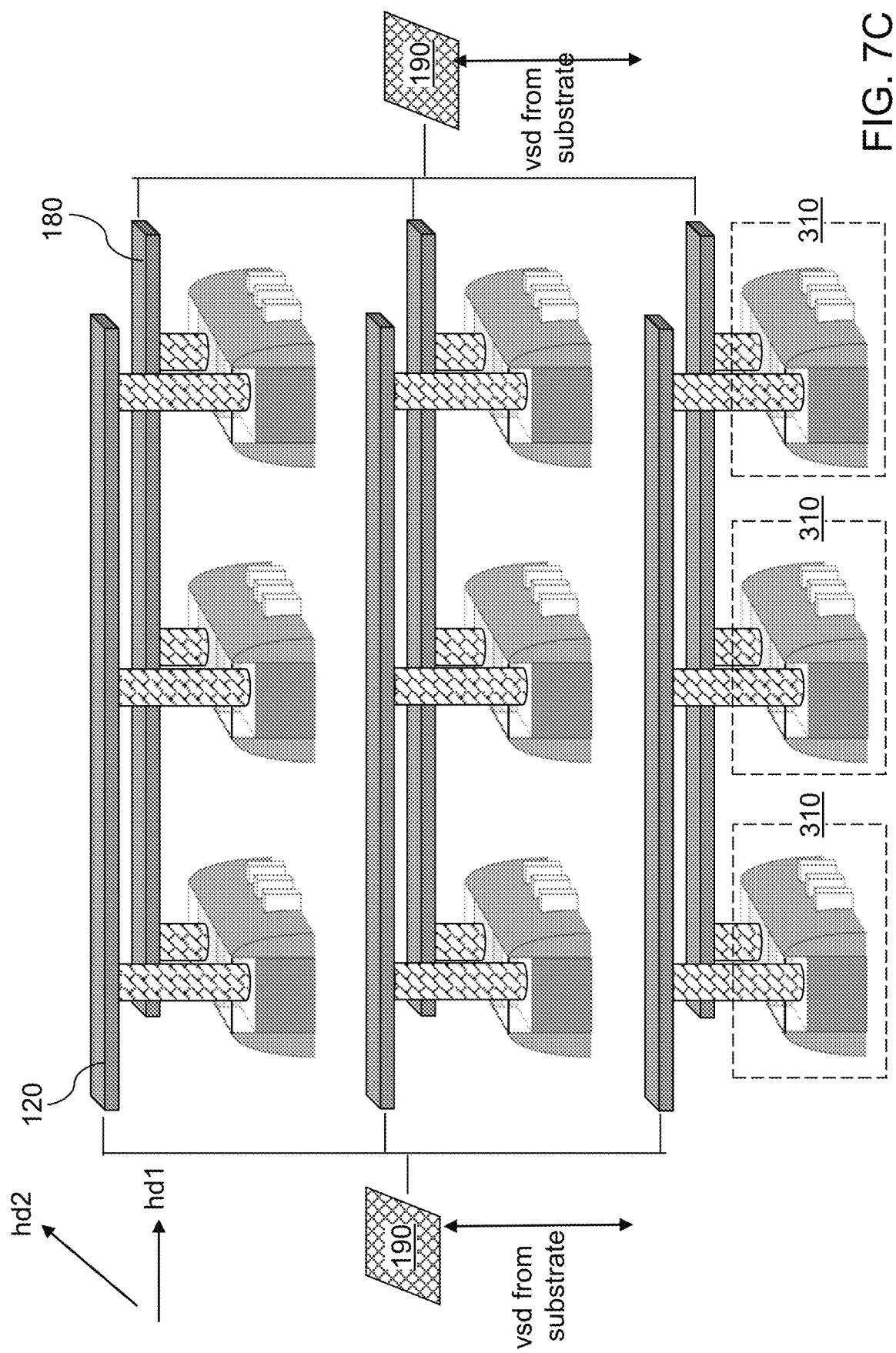
FIG. 7C is a schematic view of the second exemplary test structure at the processing steps of FIGS. 7A and 7B.

Referring to FIGS. 7A-7C, metal lines (120, 180, 130, 170) laterally extending along a first horizontal direction may be formed over the two-dimensional array of field effect transistors and the two-dimensional array of ferroelectric capacitors 150. For example, first metal lines 120 laterally extending along the first horizontal direction hd1 may be formed over, and may be electrically connected to, a respective row of gate-electrode-contact metal via structures 258. In one embodiment, the first metal lines 120 may have an areal overlap within the respective row of gate-electrode-contact metal via structures 258 in a plan view. The first metal lines 120 may directly contact top surfaces of the respective row of gate-electrode-contact metal via structures 258. Alternatively, intermediate metal lines 122 and intermediate metal via structures 268 may be used to form the first metal lines 120 at least one level above the metal line level located immediately above the top surfaces of the gate-electrode-contact metal via structures 258.

Second metal lines 180 may be formed over, and may be electrically connected to, a respective row of ferroelectric-electrode-contact via structures 248. The second metal lines 180 may directly contact top surfaces of the respective row of ferroelectric-electrode-contact via structures 248. Alternatively, intermediate metal lines (not shown) and intermediate metal via structures (not shown) may be used to form the second metal lines 180 at least one level above the metal line level located immediately above the top surfaces of the ferroelectric-electrode-contact via structures 248. While the present disclosure is described using an embodiment in which the first metal lines 120 and the second metal lines 180 are formed at different levels, embodiments are expressly contemplated herein in which the first metal lines 120 and the second metal lines 180 are formed at the same level. Further, while the present disclosure is described using an embodiment in which the first metal lines 120 are formed at a level located above the level of the second metal lines 180, embodiments are expressly contemplated herein in which the second metal lines 180 are formed at a level located above the level of the first metal lines 120.

The second metal lines 180 may laterally extend along a same horizontal direction as the first metal lines 120, e.g., along the first horizontal direction hd1. In one embodiment, the first horizontal direction hd1 may be parallel to the lengthwise direction of the semiconductor fins 220, i.e., the direction along which electrical current flows within each semiconductor fin 220.

The two-dimensional array of fin field effect transistors may underlie the two-dimensional array of ferroelectric capacitors 150. Each first electrode 152 of the two-dimensional array of ferroelectric capacitors 150 may contact a respective gate electrode 250 of the two-dimensional array of fin field effect transistors.

Third metal lines 130 laterally extending along the first horizontal direction hd1 may be formed. Each third metal line 130 overlies, and is electrically connected to, a respective row of source-contact metal via structures 226. The third metal lines 130 may contact top surfaces of the source-contact metal via structures 226, or may be vertically spaced from the source-contact via structures 226 and may be electrically connected to the source-contact via structures 226 through intervening metal lines and/or intervening metal via structures. The third metal lines 130 may electrically connect a respective row of source regions in the semiconductor fins 220 of the two-dimensional array of fin field effect transistors to a third metal pad (not illustrated), which is herein referred to as a source-connection metal pad.

Fourth metal lines 170 laterally extending along the first horizontal direction hd1 may be formed. Each fourth metal line 170 overlies, and is electrically connected to, a respective row of drain-contact metal via structures 228. The fourth metal lines 170 may contact top surfaces of the drain-contact metal via structures 228, or may be vertically spaced from the drain-contact via structures 228 and may be electrically connected to the drain-contact via structures 228 through intervening metal lines and/or intervening metal via structures. The fourth metal lines 170 may electrically connect a respective row of drain regions in the semiconductor fins 220 of the two-dimensional array of fin field effect transistors to a fourth metal pad (not illustrated), which is herein referred to as a drain-connection metal pad.

In one embodiment, the first metal lines 120, the second metal lines 180, the third metal lines 130, and the fourth metal lines 170 may not have any areal overlap thereamongst in a plan view, i.e., in a view along a direction that is perpendicular to the top surface of the substrate 208. In this embodiment, the second metal lines 180 do not have any areal overlap with the first metal lines 120 in the plan view, the third metal lines 130 do not have any areal overlap with the first metal lines 120 or the second metal lines 180 in the plan view, and the fourth metal lines 170 do not have any areal overlap with the first metal lines 120, the second metal lines 180, or the third metal lines 130 in the plan view.

In one embodiment, the source-connection metal pad and the drain-connection metal pad may be formed in the same level as the first metal pad 110 and the second metal pad 190. For example, the source-connection metal pad and the drain-connection metal pad may be formed in the second line-level dielectric material layer 309. Generally, the source-connection metal pad may be embedded in the same dielectric material layer as the first metal pad 110 and the second metal pad 190, and may be electrically connected to each source region within the array of sets of at least one semiconductor fin 220 through third metal interconnect structures including an array of third metal lines 130. The drain-connection metal pad may be embedded in the same dielectric material layer as the first metal pad 110 and the second metal pad 190, and may be electrically connected to each drain region within the array of set of at least one semiconductor fin 220 through fourth metal interconnect structures including an array of fourth metal lines 170.

Figure 8:
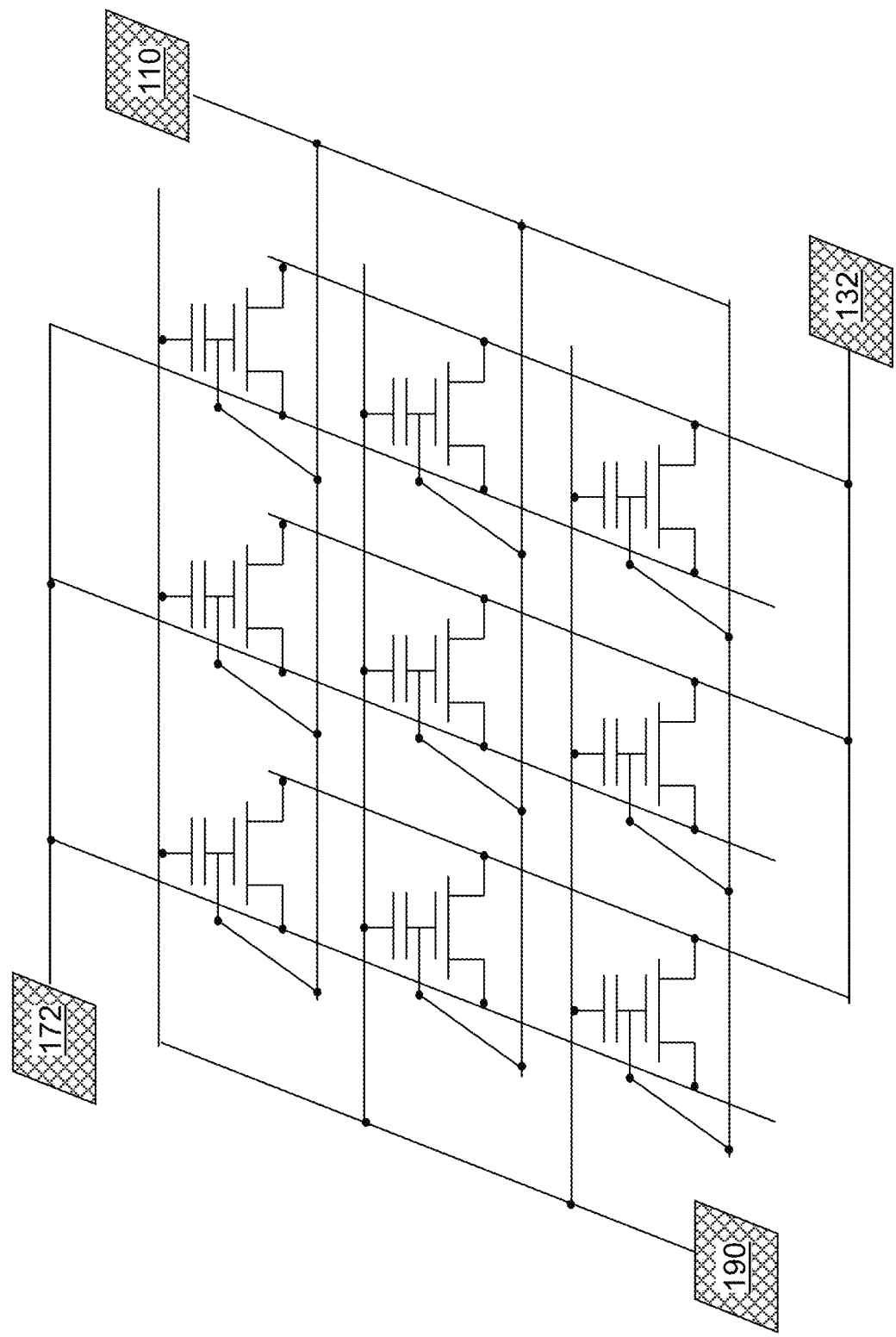
FIG. 8 is a schematic circuit diagram of the second exemplary test structure of FIGS. 7A-7C according to the second embodiment of the present disclosure.

Referring to FIG. 8, a schematic circuit diagram of the second exemplary test structure of FIGS. 7A-7C is illustrated. The combination of the two-dimensional array of field effect transistors and the two-dimensional array of ferroelectric capacitors 150 constitutes a two-dimensional array of memory devices in which a unit cell structure includes a field effect transistor and a ferroelectric memory cell comprising a ferroelectric capacitor 150 connected to the gate electrode 250 of the field effect transistor. A third metal pad 132 (which is a source-connection metal pad) is electrically connected to each source region through third metal interconnect structures, and a fourth metal pad 172 (which is a drain-connection metal pad) is electrically connected to each drain region through fourth metal interconnect structures.

The first metal pad 110, the third metal pad 132, and the fourth metal pad 172 may be used in combination to characterize a parallel connection of all field effect transistors within the two-dimensional array of field effect transistors. The first metal pad 110 and the second metal pad 190 may be used in combination to characterize a parallel connection of all ferroelectric capacitors 150 within the two-dimensional array of ferroelectric capacitors 150. The second metal pad 190, the third metal pad 132, and the fourth metal pad 172 may be used in combination to characterize a parallel connection of all ferroelectric memory devices formed by the combination of the two-dimensional array of field effect transistors and the two-dimensional array of ferroelectric capacitors 150.

Referring collectively to FIGS. 6A-9 and according to various embodiments related to the second exemplary test structure, a method of forming a structure, such as a test structure, is provided. An array of ferroelectric capacitors 150 and first metal lines 120 is formed over a substrate 208. Each ferroelectric capacitor 150 in the array of ferroelectric capacitors 150 may comprise a vertical stack including a respective first electrode 152, a respective ferroelectric material plate 154, and a respective second electrode 156. Each of the first metal lines 120 may be electrically connected to a respective row of first electrodes 152 arranged along a first horizontal direction hd1. Second metal lines 180 may be formed over the array of ferroelectric capacitors 150. Each of the second metal lines 180 may be electrically connected to a respective row of second electrodes 156 arranged along the first horizontal direction hd1. A first metal pad 110 and a second metal pad 190 may be formed over a horizontal plane including top surfaces of the array of ferroelectric capacitors 150. The first metal pad 110 may be electrically connected to the first metal lines 120, and the second metal pad 190 may be electrically connected to the second metal lines 180. In one embodiment, third metal lines 130 may be formed, which electrically connects source regions of a respective row of semiconductor fins 220 arranged along the first horizontal direction hd1 to a third metal pad 132. In one embodiment, fourth metal lines 170 may be formed, which electrically connects drain regions of a respective row of semiconductor fins 220 arranged along the first horizontal direction hd1 to a fourth metal pad 172.

According to various embodiments related to the second exemplary test structure, a ferroelectric device structure may include an array of ferroelectric capacitors 150 overlying a substrate 208 and comprising a respective first electrode 152, a respective ferroelectric material plate 154, and a respective second electrode 156; first metal interconnect structures electrically connecting each of the first electrodes 152 of the array of ferroelectric capacitors 150 to a first metal pad 110 embedded in a dielectric material layer; and second metal interconnect structures electrically connecting each of the second electrodes 156 of the array of ferroelectric capacitors 150 to a second metal pad 190 embedded in the dielectric material layer, wherein the second metal pad 190 is vertically spaced from the substrate 208 by a same vertical separation distance vsd as the first metal pad 110 is from the substrate 208. For example, the first metal pad 110 and the second metal pad 190 may be formed in any line level that is located above the top surface of the array of ferroelectric capacitors 150.

In one embodiment, the respective ferroelectric material plate 154 contacts a top surface of the respective first electrode 152, and the respective second electrode 156 contacts a top surface of the respective ferroelectric material plate 154. In one embodiment, each of the first electrodes 152 of the array of ferroelectric capacitors 150 contacts a respective first conductive structure (such as a gate electrode 250) that underlies a horizontal plane including bottom surfaces of the array of ferroelectric capacitors 150; and each of the second electrodes 156 of the array of ferroelectric capacitors 150 contacts a respective second conductive structure (such as a ferroelectric-electrode-contact via structure 248) that overlies a horizontal plane including top surfaces of the array of ferroelectric capacitors 150.

In one embodiment, the first conductive structures comprise an array of gate electrodes 250 located at a gate level; and the second conductive structures comprise an array of ferroelectric-electrode-contact metal via structures 248 located within an area of a respective underlying gate electrode 250 selected from the array of gate electrodes 250 and contacting a respective one of the second electrodes 156.

In one embodiment, the first metal interconnect structures comprise an array of gate-electrode-contact metal via structures 258 contacting a respective gate electrode 250 selected from the array of gate electrodes 250 and an array of first metal lines 120 electrically connecting the array of gate-electrode-contact metal via structures 258 to the first metal pad 110; and the second metal interconnect structures comprise an array of second metal lines 180 electrically connecting the array of ferroelectric-electrode-contact metal via structures 248 to the second metal pad 190.

In one embodiment, the ferroelectric device structure comprises an array of sets of at least one semiconductor fin 220, wherein each set of at least one semiconductor fin 220 underlies a respective gate electrode 250 selected from the array of gate electrodes 250, and is electrically isolated from the respective gate electrode 250 by a respective gate dielectric (212, 214).

In one embodiment, the ferroelectric device structure comprises: a source-connection metal pad (such as a third metal pad 132) embedded in the dielectric material layer and electrically connected to each source region within the array of sets of at least one semiconductor fin 220 through third metal interconnect structures including an array of third metal lines 130; and a drain-connection metal pad (such as a fourth metal pad 172) embedded in the dielectric material layer and electrically connected to each drain region within the array of set of at least one semiconductor fin 220 through fourth metal interconnect structures including an array of fourth metal lines 170.

In one embodiment, the array of ferroelectric capacitors 150 comprises N ferroelectric capacitors each having a same area that is in a range from 1 µm$^2$/N to 1 µm$^2$; and N is an integer greater than 1.

According to another embodiment of the present disclosure, a ferroelectric device structure is provided, which comprises: a two-dimensional array of ferroelectric capacitors 150 overlying a substrate 208 and comprising a respective first electrode 152, a respective ferroelectric material plate 154, and a respective second electrode 156; first metal lines 120 laterally extending along a first horizontal direction hd1 and located at a first metal line level and electrically connecting each of the first electrodes 152 within the two-dimensional array of ferroelectric capacitors 150 to a first metal pad 110 embedded in a dielectric material layer; and second metal lines 180 laterally extending along the first horizontal direction hd1 and located at a second metal line level and electrically connecting each of the second electrodes 156 within the two-dimensional array of ferroelectric capacitors 150 to a second metal pad 190 embedded in the dielectric material layer.

In one embodiment, the first metal lines 120 and the second metal lines 180 are vertically spaced from the substrate 208 by different vertical distances; and the first metal pad 110 and the second metal pad 190 are vertically spaced from the substrate by a same vertical separation distance vsd, for example, by forming the first metal pad 110 and the second metal pad 190 at a level of metal lines that are more distal from the substrate 208. In one embodiment, the second metal lines 180 are more proximal to the substrate 208 than the first metal lines 120 are to the substrate 208; and the first metal lines 120, the first metal pad 110, and the second metal pad 190 are vertically spaced from the substrate by a same vertical separation distance vsd.

In one embodiment, the ferroelectric device structure may comprise: a two-dimensional array of fin field effect transistors that underlie the two-dimensional array of ferroelectric capacitors 150, wherein each first electrode 152 of the two-dimensional array of ferroelectric capacitors 150 contacts a respective gate electrode 250 of the two-dimensional array of fin field effect transistors; third metal lines 130 laterally extending along the first horizontal direction hd1 and electrically connecting a respective row of source regions in semiconductor fins 220 of the two-dimensional array of fin field effect transistors to a third metal pad 132; and fourth metal lines 170 laterally extending along the first horizontal direction hd1 and electrically connecting a respective row of drain regions in the semiconductor fins 220 of the two-dimensional array of fin field effect transistors to a fourth metal pad 172.

In one embodiment, the second metal lines 180 do not have any areal overlap with the first metal lines 120 in a plan view along a direction that is perpendicular to a top surface of the substrate 208; the third metal lines 130 do not have any areal overlap with the first metal lines 120 or the second metal lines 180 in the plan view; and the fourth metal lines 170 do not have any areal overlap with the first metal lines 120, the second metal lines 180, or the third metal lines 130 in the plan view.

Figure 9:
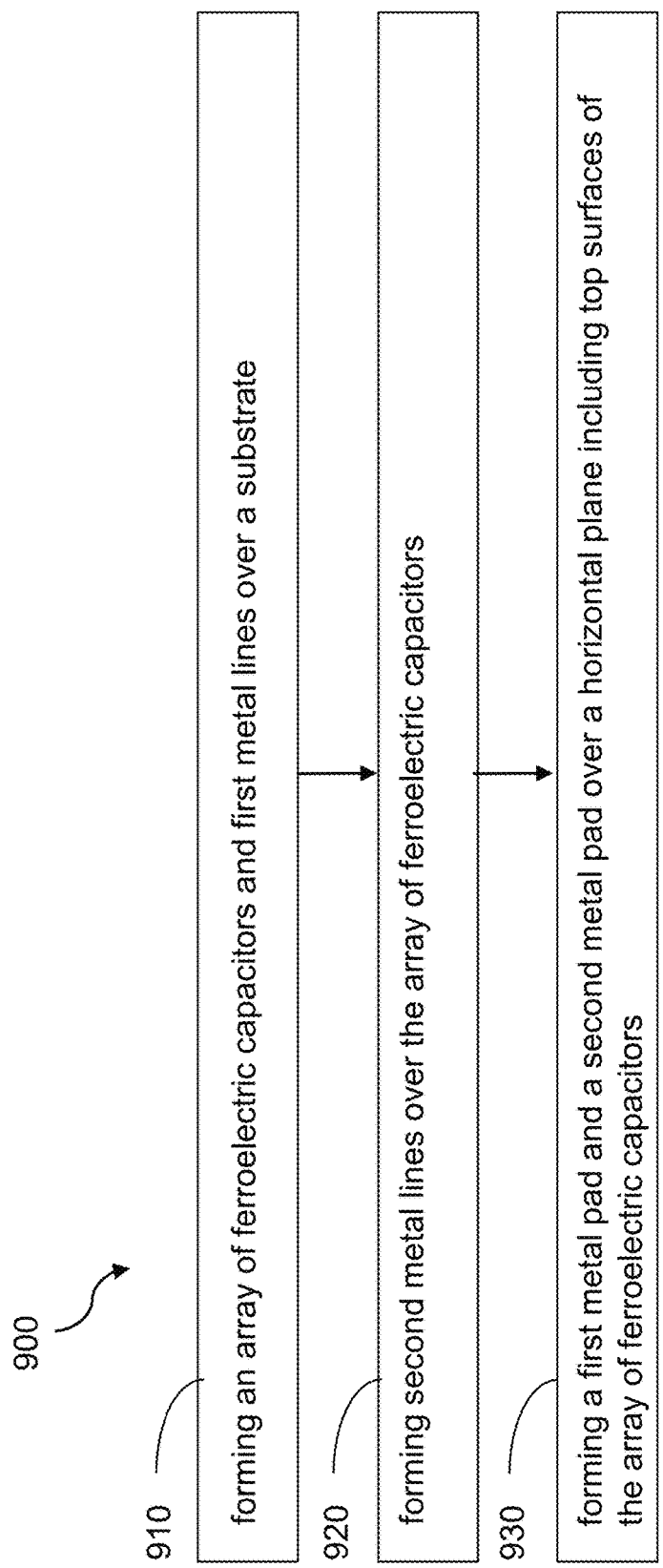
FIG. 9 is a flowchart that illustrates the general processing steps of methods of the present disclosure.

Referring to FIG. 9, a flowchart 900 illustrates the general processing steps of methods of the present disclosure. Referring to step 910, an array of ferroelectric capacitors 150 and first metal lines 120 may be formed over a substrate (10, 208). Each ferroelectric capacitor 150 in the array of ferroelectric capacitors 150 comprises a vertical stack including a respective first electrode 152, a respective ferroelectric material plate 154, and a respective second electrode 156.

Each of the first metal lines 120 may be electrically connected to a respective row of first electrodes 152 arranged along a first horizontal direction hd1.

Referring to step 920, second metal lines 180 may be formed over the array of ferroelectric capacitors 150. Each of the second metal lines 180 may be electrically connected to a respective row of second electrodes 156 arranged along the first horizontal direction hd1. Referring to step 930, a first metal pad 110 and a second metal pad 190 may be formed over a horizontal plane including top surfaces of the array of ferroelectric capacitors 150. The first metal pad 110 may be electrically connected to the first metal lines 120, and the second metal pad 190 may be electrically connected to the second metal lines 180.

Referring to all drawings and according to various embodiments of the present disclosure, a ferroelectric device structure is provided, which comprises: an array of ferroelectric capacitors 150 overlying a substrate (10, 208) and comprising a respective first electrode 152, a respective ferroelectric material plate 154, and a respective second electrode 156; first metal interconnect structures electrically connecting each of the first electrodes 152 of the array of ferroelectric capacitors 150 to a first metal pad 110 embedded in a dielectric material layer; and second metal interconnect structures electrically connecting each of the second electrodes 156 of the array of ferroelectric capacitors 150 to a second metal pad 190 embedded in the dielectric material layer, wherein the second metal pad 190 is vertically spaced from the substrate (10, 208) by a same vertical separation distance vsd as the first metal pad 110 is from the substrate (10, 208).

According to another embodiment of the present disclosure, a ferroelectric device structure is provided, which comprises: a two-dimensional array of ferroelectric capacitors 150 overlying a substrate (10, 208) and comprising a respective first electrode 152, a respective ferroelectric material plate 154, and a respective second electrode 156; first metal lines 120 laterally extending along a first horizontal direction hd1 and located at a first metal line level and electrically connecting each of the first electrodes 152 within the two-dimensional array of ferroelectric capacitors 150 to a first metal pad 110 embedded in a dielectric material layer; and second metal lines 180 laterally extending along the first horizontal direction hd1 and located at a second metal line level and electrically connecting each of the second electrodes 156 within the two-dimensional array of ferroelectric capacitors 150 to a second metal pad 190 embedded in the dielectric material layer.

The various embodiments of the present disclosure may be used to provide a test structure that accurately amplifies device characteristics of a ferroelectric device having a small ferroelectric material that does not generate sufficient signal strength during testing. The various structures and methods of the present disclosure may be used to provide accurate characterization of ferroelectric devices with dimensions on the order of several microns or less. Particularly, the structures and methods of the present disclosure may be used to provide a characterization method for ferroelectric devices having lateral dimensions less than 1 micron.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a ferroelectric device, comprising:
    forming an array of field effect transistors comprising an array of gate electrodes over a substrate;
    forming an array of ferroelectric capacitors and first metal lines over the array of field effect transistors, wherein each ferroelectric capacitor in the array of ferroelectric capacitors comprises a vertical stack including a respective first electrode, a respective ferroelectric material plate, and a respective second electrode, and wherein each of the first metal lines is electrically connected to a respective row of first electrodes arranged along a first horizontal direction, and wherein each of the first electrodes of the array of ferroelectric capacitors comprises a respective bottom surface that is in direct contact with a top surface of a respective gate electrode selected from the array of gate electrodes;
    forming second metal lines over the array of ferroelectric capacitors, wherein each of the second metal lines is electrically connected to a respective row of second electrodes arranged along the first horizontal direction; and
    forming a first metal pad and a second metal pad over the array of ferroelectric capacitors, wherein the first metal pad is electrically connected to the first metal lines and the second metal pad is electrically connected to the second metal lines.

2. The method of claim 1, further comprising forming an array of gate-electrode-contact metal via structures directly on a respective gate electrode among the array of gate electrodes, wherein the first metal lines are formed over, and are electrically connected to, a respective row of gate-electrode-contact metal via structures.

3. The method of claim 1, further comprising forming an array of ferroelectric-electrode-contact via structures directly on a respective second electrode within the array of ferroelectric capacitors, wherein the second metal lines are formed over, and are electrically connected to, a respective row of ferroelectric-electrode-contact via structures.

4. The method of claim 1, wherein each field effect transistor within the array of field effect transistors comprises a fin field effect transistor including a respective set of at least one semiconductor fin.

5. The method of claim 4, wherein each set of at least one semiconductor fin underlies a respective gate electrode selected from the array of gate electrodes, and is electrically isolated from the respective gate electrode by a respective gate dielectric.

6. The method of claim 5, further comprising:
    forming third metal lines electrically connecting source regions of a respective row of semiconductor fins arranged along the first horizontal direction to a third metal pad; and
    forming fourth metal lines electrically connecting drain regions of a respective row of semiconductor fins arranged along the first horizontal direction to a fourth metal pad.

7. The method of claim 1, further comprising forming dielectric gate spacers around a respective vertical stack of a gate electrode among the array of field effect transistors and a ferroelectric capacitor among the array of ferroelectric capacitors.

8. The method of claim 1, further comprising forming dielectric gate spacers directly on sidewalls of a respective ferroelectric capacitor among the array of ferroelectric capacitors.

9. The method of claim 1, wherein each ferroelectric capacitor among the array of ferroelectric capacitors has a same width as a respective underlying gate electrode among the array of gate electrodes.

10. The method of claim 1, wherein each ferroelectric capacitor among the array of ferroelectric capacitors has a lesser length than a respective underlying gate electrode among the array of gate electrodes.

11. The method of claim 1, further comprising an array of gate cap dielectrics overlying the array of gate electrodes, wherein each ferroelectric capacitor comprises a sidewall that contacts a respective gate cap dielectric among the array of gate cap dielectrics, and each ferroelectric capacitor has a respective top surface formed within a same horizontal plane as a top surface of a respective one of the gate cap dielectrics.

12. A method of forming a ferroelectric device structure, comprising:
    forming an array of field effect transistors over a substrate;
    forming an array of ferroelectric capacitors over the array of field effect transistors, wherein each of the ferroelectric capacitors comprises a respective first electrode, a respective ferroelectric material plate, and a respective second electrode, and each ferroelectric capacitor within the array of ferroelectric capacitors is formed directly on a top surface of a respective gate electrode of a respective field effect transistor within the array of field effect transistors;
    forming dielectric gate spacers around a respective vertical stack of a gate electrode selected from the array of field effect transistors and a ferroelectric capacitor selected from the array of ferroelectric capacitors;
    forming a first metal pad embedded in a dielectric material layer over the array of ferroelectric capacitors, wherein the first metal pad is electrically connected to each gate electrode within the array of field effect transistors; and
    forming a second metal pad embedded in the dielectric material layer over the array of ferroelectric capacitors, wherein the second metal pad is electrically connected to each second electrode within the array of ferroelectric capacitors.

13. The method of claim 12, wherein each of the dielectric gate spacers is formed directly on a straight sidewall of a respective gate electrode and a straight sidewall of a respective ferroelectric capacitor that are vertically coincident with each other.

14. The method of claim 12, further comprising:
    forming first metal interconnect structures electrically connecting each of the first electrodes of the array of ferroelectric capacitors to the first metal pad in the dielectric material layer; and
    forming second metal interconnect structures electrically connecting each of the second electrodes of the array of ferroelectric capacitors to the second metal pad in the dielectric material layer.

15. The method of claim 14, wherein:
    the first metal interconnect structures comprise an array of gate-electrode-contact metal via structures that are formed directly on a respective one of the gate electrodes and comprise an array of first metal lines electrically connecting the array of gate-electrode-contact metal via structures to the first metal pad; and the second metal interconnect structures comprise an array of ferroelectric-electrode-contact metal via structures that are formed directly on a respective second electrode and comprise an array of second metal lines electrically connecting the array of ferroelectric-electrode-contact metal via structures to the second metal pad.

16. The method of claim 12, wherein:

each of the first electrodes is formed directly on a first segment of a top surface of a respective gate electrode among the array of array of field effect transistors; and the method comprises forming an array of gate cap dielectrics, wherein each of the gate cap dielectrics is formed directly on a sidewall of a respective ferroelectric capacitor within the array of ferroelectric capacitors.

17. The method of claim 16, further comprising forming dielectric gate spacers laterally around a respective contiguous combination of a gate electrode among array of field effect transistors, a ferroelectric capacitor among the array of ferroelectric capacitors, and a gate cap dielectric among the array of gate cap dielectrics.

18. A method of forming ferroelectric device structure, comprising:

forming an array of field effect transistors over on a substrate;

forming an array of ferroelectric capacitors over the array of field effect transistors, wherein each of the ferroelectric capacitors comprises a respective first electrode, a respective ferroelectric material plate, and a respective second electrode;

forming an array of gate-electrode-contact metal via structures on a respective gate electrode in the array of field effect transistors;

forming an array of ferroelectric-electrode-contact metal via structures on a respective second electrode in the array of ferroelectric capacitors;

forming a first metal pad electrically connected to each gate-electrode-contact metal via structure within the array of gate-electrode-contact metal via structures;

forming a second metal pad electrically connected to each ferroelectric-electrode-contact metal via structure within the array of ferroelectric-electrode-contact metal via structures;

forming an array of first metal lines embedded in a dielectric material layer over the array of gate-electrode-contact metal via structures, wherein the array of first metal lines electrically connect the array of gate-electrode-contact metal via structures to the first metal pad; and forming an array of second metal lines embedded in the dielectric material layer over the array of ferroelectric-electrode-contact metal via structures, wherein the array of second metal lines electrically connect the array of ferroelectric-electrode-contact metal via structures to the second metal pad.

19. The method of claim 18, wherein:

the array of field effect transistors comprises an array of sets of at least one semiconductor fin containing a respective source region and a respective drain region; and the method comprises:

forming a source-connection metal pad electrically connected to each source region within the array of sets of at least one semiconductor fin; and forming a drain-connection metal pad electrically connected to each drain region within the array of set of at least one semiconductor fin.

20. The method of claim 18, wherein each of the first electrodes of the array of ferroelectric capacitors is formed directly on a top surface of a respective gate electrode within the array of field effect transistors.

* * * * *